United States Patent
Sakata

[11] Patent Number: 6,134,368
[45] Date of Patent: Oct. 17, 2000

[54] OPTICAL SEMICONDUCTOR DEVICE WITH A CURRENT BLOCKING STRUCTURE AND METHOD FOR MAKING THE SAME

[75] Inventor: Yasutaka Sakata, Tokyo, Japan

[73] Assignee: NEC Corporation, Japan

[21] Appl. No.: 08/927,111

[22] Filed: Aug. 29, 1997

[30] Foreign Application Priority Data

Aug. 30, 1996 [JP] Japan ................................. 8-230373

[51] Int. Cl.[7] .................................................. G02B 6/13
[52] U.S. Cl. ........................... 385/131; 385/132; 438/31; 438/481; 372/50
[58] Field of Search ................................... 385/131, 132; 438/29, 31, 478–481; 372/43–50

[56] References Cited

U.S. PATENT DOCUMENTS

| | | | |
|---|---|---|---|
| 5,284,791 | 2/1994 | Sakata et al. | 437/129 |
| 5,360,763 | 11/1994 | Nakamura | 437/129 |
| 5,382,543 | 1/1995 | Nakamura et al. | 437/129 |
| 5,717,710 | 2/1998 | Miyazaki et al. | 372/50 |

FOREIGN PATENT DOCUMENTS

| | | | |
|---|---|---|---|
| 4127490 | 4/1992 | Japan | H01S 3/18 |
| 5-13889 | 1/1993 | Japan | H01S 3/19 |
| 5235477 | 9/1993 | Japan | H01S 3/18 |
| 5-343808 | 12/1993 | Japan | H01S 3/18 |
| 6-104527 | 4/1994 | Japan | H01S 3/18 |
| 6-177487 | 6/1994 | Japan | H01S 3/18 |
| 6-314657 | 11/1994 | Japan | H01L 21/205 |
| 7-7232 | 1/1995 | Japan | H01S 3/18 |
| 7-193210 | 7/1995 | Japan | H01L 27/15 |
| 2298312 | 8/1996 | United Kingdom | H01S 3/19 |

OTHER PUBLICATIONS

"Electrical property of a p–n–i–n structure having an MOCVD–grown undoped Al.48In.52As layer as the i layer", Kimura et al., The Institute of a Applied Physics., Spring 1995.

Y. Sakata et al./Strained MQW–BH–LDs and intigrated devices fabricated by select MOVPE—Apr. 21, 1996—pp761–764/USLI Device Development Laboratories NEC Corporation.

"DFB–LD/Modulator Integrated Light Source By Bandgap Energy Controlled Selective Movpe " Kato et al Electronics Letters; Jan. 16, 1992; vol. 28. No. 2; pp. 153–154.

"Novel Structure MQW Electroabsorption Modulator/DFB–Laser Integrated Device Fabricated by Selective Area Mocvd Growth"; Aoki et al Electronics Letters; Nov. 7, 1991; vol. 27. No. 23; pp. 2138–2140.

"High–Power and High–Speed Semi–Insulating BH Structure Monolithic Electroabsorption Modulator/DFB Laser Light Source" Soda et al Electronics Letters; Jan. 4, 1990; vol. 26. No. 1; pp. 9–10.

"Chirp characteristics of an 1.55um DFB laser integrated electroabsorption modulator" Aoki et al Autumn Meeting C–96 of The Intitue of Elctronics; vol. 26, No. 1 pp. 4–176, 1993 (No month).

(List continued on next page.)

*Primary Examiner*—John D. Lee
*Attorney, Agent, or Firm*—Hayes, Soloway, Hennessey, Grossman & Hage, P.C.

[57] ABSTRACT

Disclosed is an optical semiconductor device which has:
an optical waveguide where a multilayer structure including an active layer is selectively grown like a stripe with both side facets provided with a specific crystalline surface; and a semiconductor current blocking structure which is formed in contact with the side facets of the optical waveguide, the optical waveguide and the semiconductor current blocking structure being formed on a main plane of a first conductivity-type semiconductor substrate; wherein the semiconductor current blocking structure comprises a bottom surface which is selectively formed to contact only the main plane near the optical waveguide.

9 Claims, 13 Drawing Sheets

OTHER PUBLICATIONS

"Low Penalty transmission characteristics of packaged DFB–LD/modulator integrated light source with selectively grown window–facet structure fabricated by bandgap energy controlled selective MOVPE; Kato et al; Informations and Communications Engineers 1993" Spring Meeting C–226 of The Institue of Electronics, pp. 4–223, 1994 (No month).

"All selective MOVPE grown 1.3um strained MQW BH–LDs" Sakata et al The Institue of Electronics, Information and Communication Engineers; Technical Report of IEICE; LqE95–88(1995–10); pp. 39–44, Oct. 1995.

"Electrical peoperty of a p–n–i–n structure having an MOCVD–grown undoped $Al_{0.48}IN_{0.52}As$ laye as the i layer" Kimura et al 30a–SZY–4; The institute of Applied Physics, Spring 1995.

"All Selective MOVPE Grown BH–LD's Fabricated by the Novel Self–Alignment Process" Sakata et al IEEE Photonics Technology Letters, vol. 8, No. 2, Feb. 1996; pp. 179–181.

Shinagaku Technical Report, vol. 95 No. 294, LQE–88, pp 39–44, 1995 (No month).

I   EA MODULATOR REGION
II  CONNECTING REGION
III DFB LASER REGION

OPTICAL SEMICONDUCTOR DEVICE WITH A CURRENT BLOCKING STRUCTURE AND METHOD FOR MAKING THE SAME

FIELD OF THE INVENTION

This invention relates to an optical semiconductor device more particularly to, an optical semiconductor device with a current-blocking structure and a method for making the same.

BACKGROUND OF THE INVENTION

A light source which is fabricated integrating a DFB (distributed feedback) laser with an EA (electro-absorption) modulator on a substrate has a very small wavelength variation(chirping) during the modulation operation. Therefore, it is important as a light source for more than several tens to hundreds kilometer long-distance optical communication at more than 2.5 to 10 Gb/s. When the DFB laser and the EA modulator are monolithically integrated, it is required that regions with different bandgap energies are formed on the substrate since they have different operation wavelengths(bandgap energies).

H. Soda et al., "HIGH-POWER AND HIGH-SPEED SEMI-INSULATING BH STRUCTURE MONOLITHIC ELECTROABSORPTION MODULATOR/DFB LASER LIGHT SOURCE", ELECTRONICS LETTERS, Vol. 26, No. 1, pp. 9–10(1990) [First Prior Art] discloses a semiconductor optical device where a DFB laser and an EA modulator are monolithically integrated as shown in FIG. 1. In fabrication, a grating 201a is partially formed on a n-InP substrate 201, then an optical guiding layer 103, an etching stopper layer 212 and a laser active layer 204a, which are a laser layer structure, are grown on the entire surface of the substrate, then only the laser active layer 204a corresponding to a modulator region is selectively etched and an optical absorption layer 204b is formed there by burying regrowth, and a p-InP cladding layer 206 and a cap layer 207 are finally grown, whereby a butt-joint structure is obtained. In this structure, a relatively high optical coupling efficiency more than 80% between the laser and the modulator is obtained. However, it is difficult to control the etching and the buried-regrowth to reproducibly obtain a good structure.

M. Aoki et al., ELECTRONICS LETTERS, Vol.27, No.23, pp.2138–2140(1991) and IEICE, Autumn Meeting C-96, preparatory papers No.4–176(1993) [Second Prior Art] disclose a DFB laser/optical modulator jointed structure where the width of a growth-blocking mask can be varied by selective MOVPE to control bandgap energies of waveguide, thereby achieving an optical coupling efficiency of about 100%.

In fabrication, as shown in FIG. 2A, a pair of growth-blocking masks 302 with a mask width of several tens to hundreds μm are formed only on the laser region of a n-InP substrate 301 while having a spacing of several tens μm. Then, an optical guiding layer 303, an active layer 304 and p-InP cladding layer 307 are, as shown in FIG. 2A, grown by selective MOVPE. Then, as shown in FIG. 2C, an optical waveguide with a width of 1.5 to 2.0 Mm is formed by mesa-etching both the laser region and the modulator region, and then a Fe-doped InP layer 313 as a high-resistance layer is grown burying on both sides of the optical waveguide.

However, in the above fabrication method, there are problems that it needs the semiconductor mesa-etching process to form the optical waveguide, where width, height etc. of the mesa have to be severely controlled, and that the product yield is therefore reduced.

On the other hand, T. Kato et al., ELECTRONICS LETTERS, Vol.28, No.2, pp.153–154(1992) and IEICE, Spring Meeting C-226, preparatory papers No.4–223(1994) [Third Prior Art] disclose a DFB laser/EA modulator integrated light source where an optical waveguide is fabricated without etching a semiconductor layer while having good controllability and reproducibility.

In fabrication, as shown in FIG. 3A, a pair of $SiO_2$ stripe masks 20 with a spacing of 1.5 to 2.0 μm are formed in the [011] direction on a n-InP substrate 21. Then, as shown in FIG. 3B, an optical guiding layer 22, an active layer 23 and a p-InP cladding layer 24 are formed on a region sandwiched between the $SiO_2$ masks by selective MOVPE. At this time, on the side facet of the optical waveguide composed of these layers, a (111)B crystalline surface is automatically formed. Therefore, a mesa-stripe structure with a high uniformity can be produced.

Then, as shown in FIG. 3C, the $SiO_2$ masks 20 as a frame for the mesa stripe are widened, thereafter a p InP layer 25 and a $p^+$-InGaAs cap layer 26 are epitaxially grown by selective MOVPE. Finally, forming electrodes, a laser structure as shown in FIG. 3D is obtained.

As described above, the optical waveguide can be directly formed by using selective MOVPE, where the mesa-etching of the semiconductor layer is not necessary. Thus, the DFB laser/EA modulator integrated light source with good controllability and reproducibility as well as a high product yield can be fabricated.

However, in the above fabrication method, a current blocking structure cannot be provided. Thus, there are problems that a threshold value for laser oscillation cannot be reduced and that it is difficult to operate using a high light output power.

As a solution of the problems of the third prior art, Y. Sakata et al., TECHNICAL REPORT OF IEICE, LQE95-88, PP.39–44(1995) [Fourth Prior Art] discloses a 1.3 μm strained MQW BH-LDs with a current blocking structure.

In fabrication, a pair of $SiO_2$ stripe masks 2-1, 2-2 with an opening width of 1.5 μm are, as shown in FIG. 4A, are formed in the [011] direction on a n-InP substrate 1, then an optical waveguide composed of an optical guiding layer 3-1, an active layer 3-2 and a cladding layer 3-3 is directly formed on a region sandwiched between the $SiO_2$ masks 2-1, 2-2 by selective MOVPE, like the third prior art. Then, as shown in FIG. 4B, a $SiO_2$ mask 4 is formed on the optical waveguide. 15 using this as a growth blocking mask, the current blocking structure composed of a p-InP layer 5 and a n-InP layer 6 is buried(FIG. 4C). Then, after removing the $SiO_2$ mask 4, a p-InP cladding layer 8 and a $P^+$-$In_yGa_{1-y}As$ cap layer 9 are formed as shown in FIG. 4D. Finally, mesa-etching to form a groove for separating the device and forming 20 electrodes, a semiconductor laser as shown in FIG. 5 is obtained. Thus, a semiconductor laser, which can be operated at a low threshold and a high efficiency, can be produced with good uniformity and controllability.

However, in the above fabrication method, it is difficult to form the narrow mesa structure with a width less than about 10 μm while having good controllability and a small dispersion among produced devices since the groove for separating the device needs to be formed by mesa-etching. Also, due to the steep side wall of the narrow mesa structure itself, the breaking of electrodes may occur. Thus, due to the difficulty in the formation of the narrow mesa structure, particularly, when a laser/modulator integrated light source is fabricated, the device capacity of the modulator part may be increased and the high-speed operation at higher than 1 Gb/s may not be therefore achieved.

SUMMARY OF THE INVENTION

Accordingly, it is an object of the invention to provide an optical semiconductor device which is provided with a narrow mesa structure while having a low device capacity.

It is a further object of the invention to provide a method for making the optical semiconductor device.

According to the invention, an optical semiconductor device, comprises:

an optical waveguide where a multilayer structure including an active layer is selectively grown like a stripe with both side facets provided with a specific crystalline surface; and a semiconductor current blocking structure which is formed in contact with the side facets of the optical waveguide, the optical waveguide and the semiconductor current blocking structure being formed on a main plane of a semiconductor substrate of a first conductivity-type;

wherein the semiconductor current blocking structure comprises a bottom surface which is selectively formed to contact only the main plane near the optical waveguide.

According to another aspect of the invention, a method for making an optical semiconductor device, comprises the steps of:

forming a first mask and a second mask which selectively cover a main plane of a semiconductor substrate of a first conductivity-type and are mirror-symmetrical to each other;

forming an optical waveguide composed of a multilayer structure including an active layer on the main plane enclosed by the first and second masks by the selective epitaxial growth method;

forming a third mask and a fourth mask selectively covering the main plane while sandwiching the optical waveguide and a fifth mask covering the top surface of the optical waveguide after removing the first and second masks;

forming a semiconductor current blocking structure on a region which is not covered by the third, fourth and fifth masks by the selective epitaxial growth method; and forming a first semiconductor layer of a second conductivity-type by the selective epitaxial growth method after removing the fifth mask.

In the invention, the optical waveguide and semiconductor current blocking structure are formed by using the selective epitaxial growth method. Namely, the etching process of forming a groove for separating the device is not necessary. Therefore, an optical semiconductor device provided with a narrow mesa structure while having a low device capacity can be obtained.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
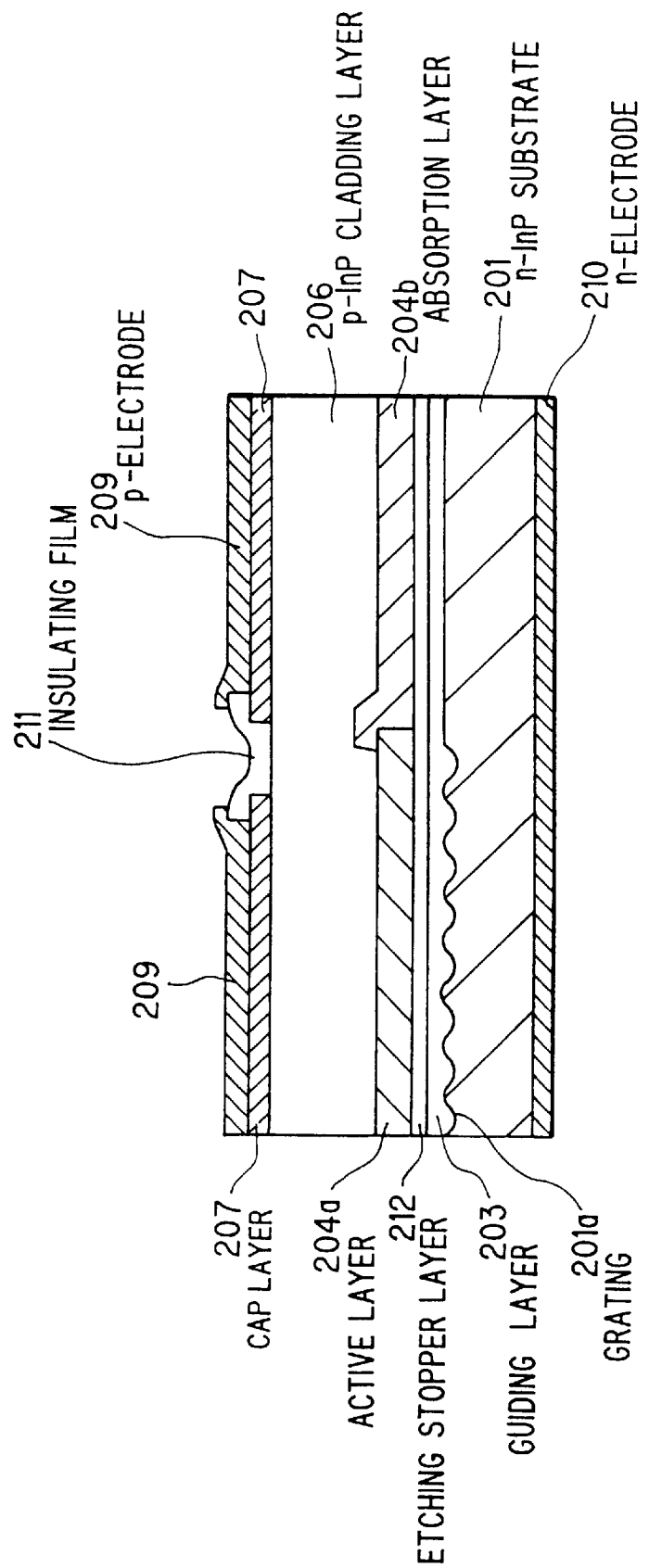
FIG. 1 is a cross sectional view showing the conventional optical semiconductor device [First Prior Art]
Figure 2A:
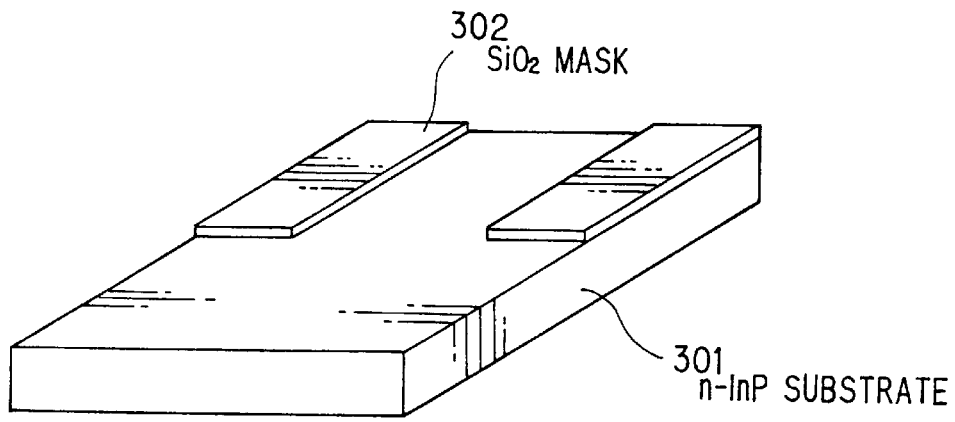
FIGS. 2A to 2C are perspective views and a cross sectional view showing the conventional optical semiconductor device [second Prior Art]
Figure 2B:
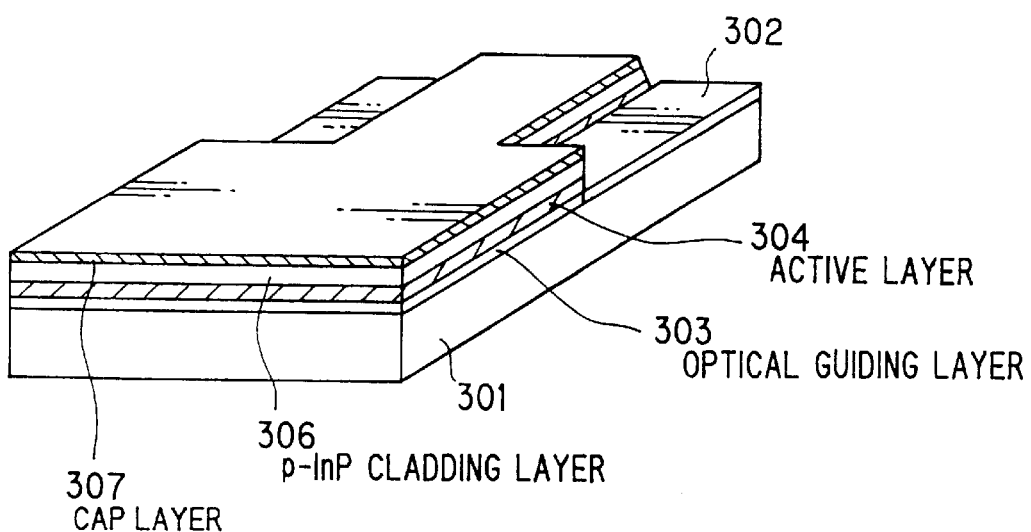
Figure 2C:
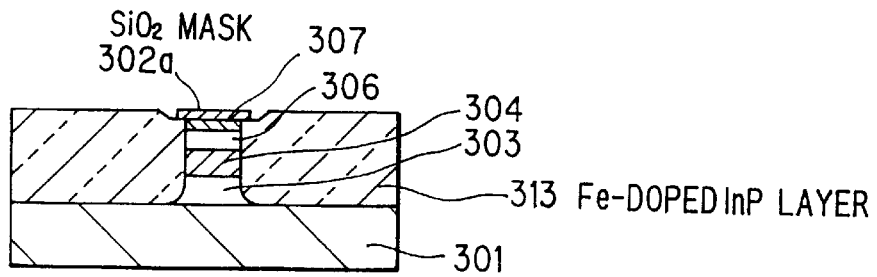
Figure 3A:
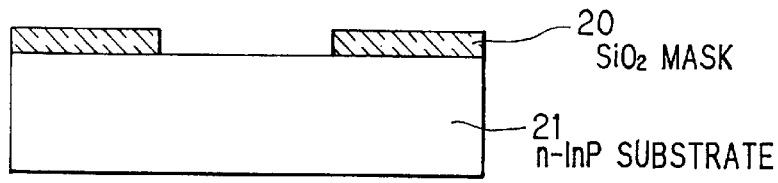
FIGS. 3A to 3D are cross sectional views showing the conventional optical semiconductor device [Third Prior Art]
Figure 3B:
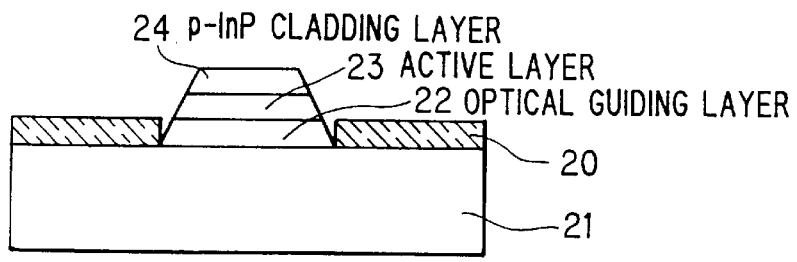
Figure 3C:
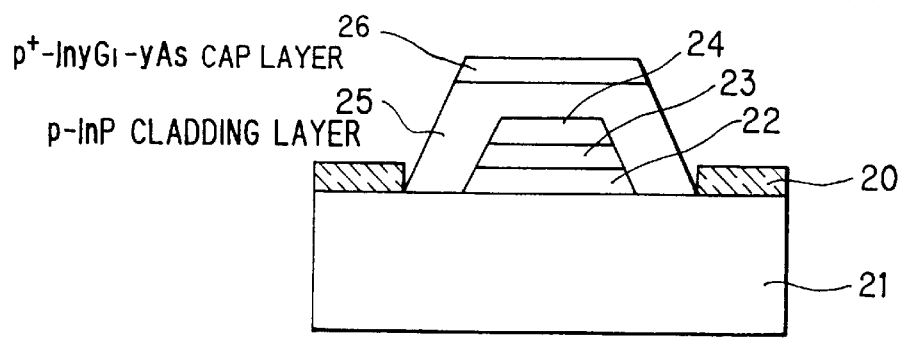
Figure 3D:
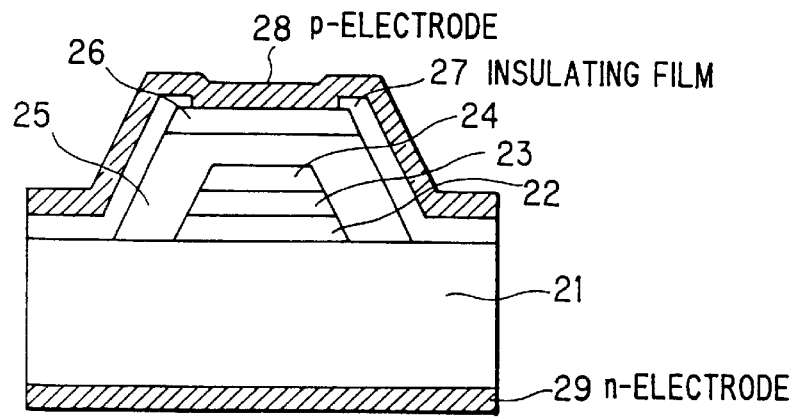
Figure 4A:
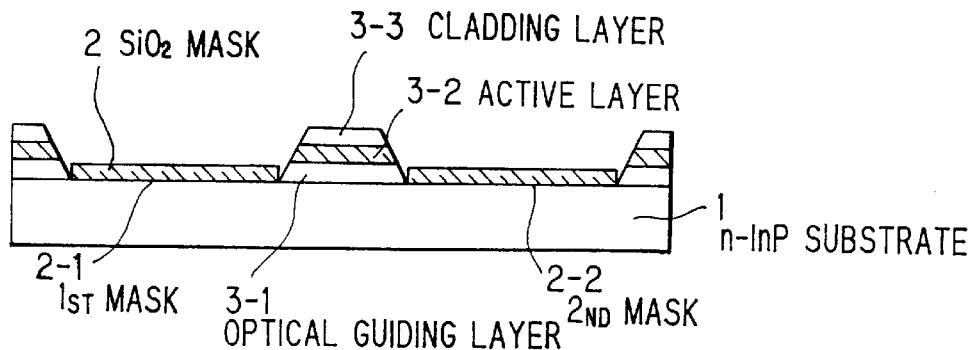
FIGS. 4A to 4D and 5 are cross sectional views and a cross sectional view showing the conventional optical semiconductor device [Fourth Prior Art]
Figure 4B:
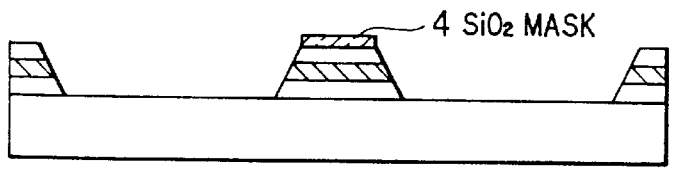
Figure 4C:
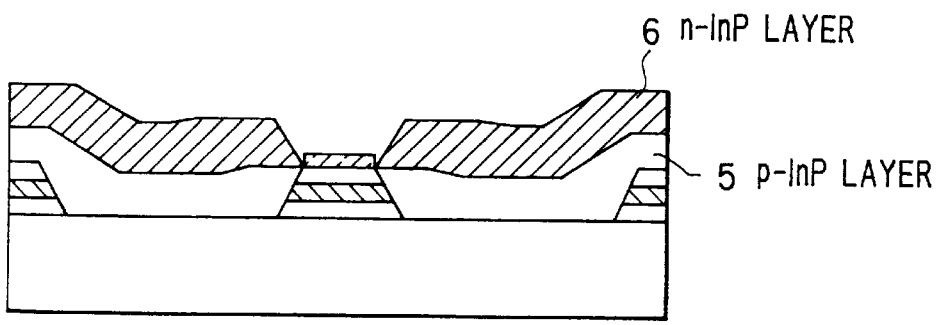
Figure 4D:
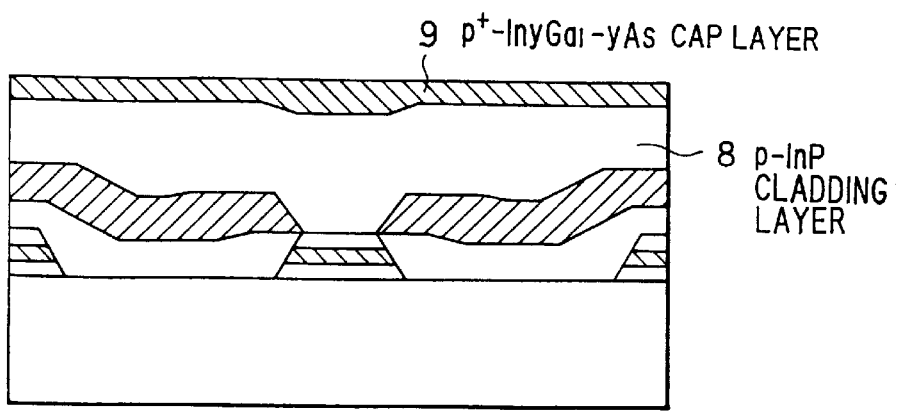
Figure 5:
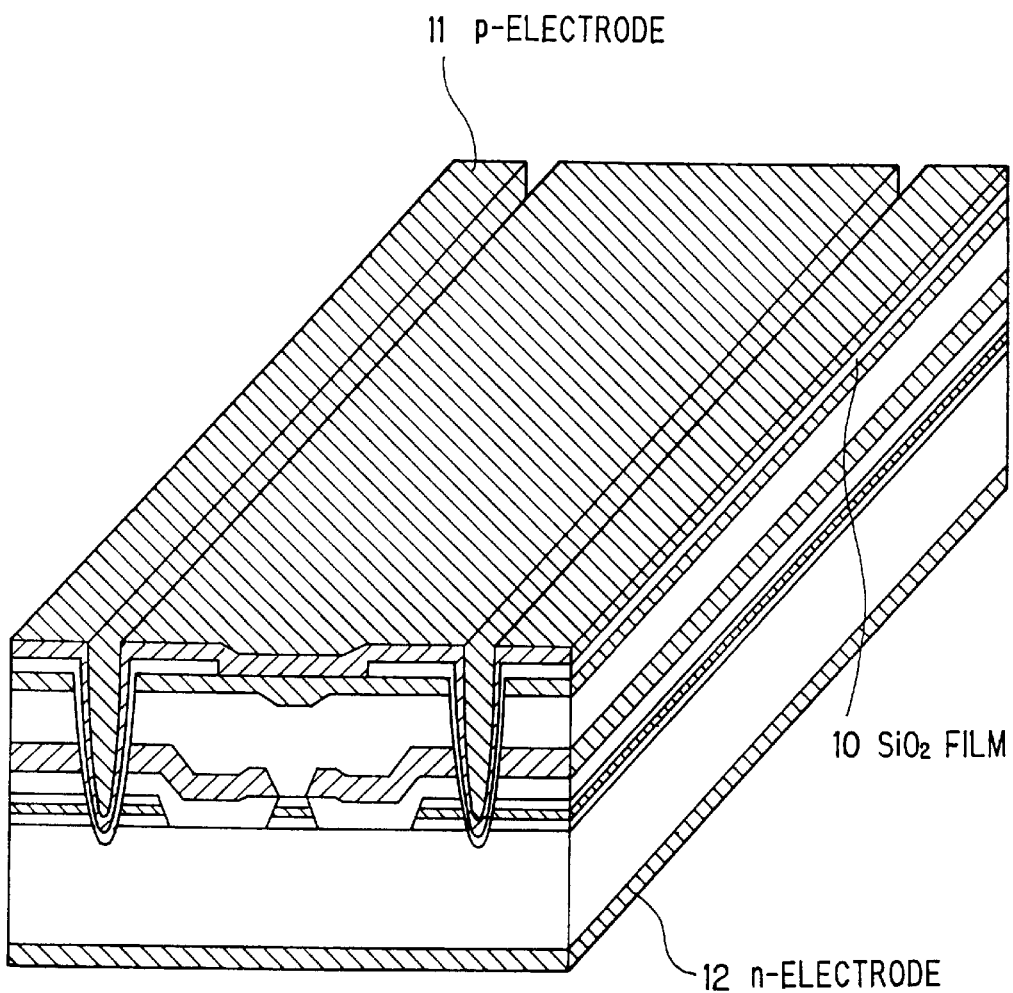
Figure 6:
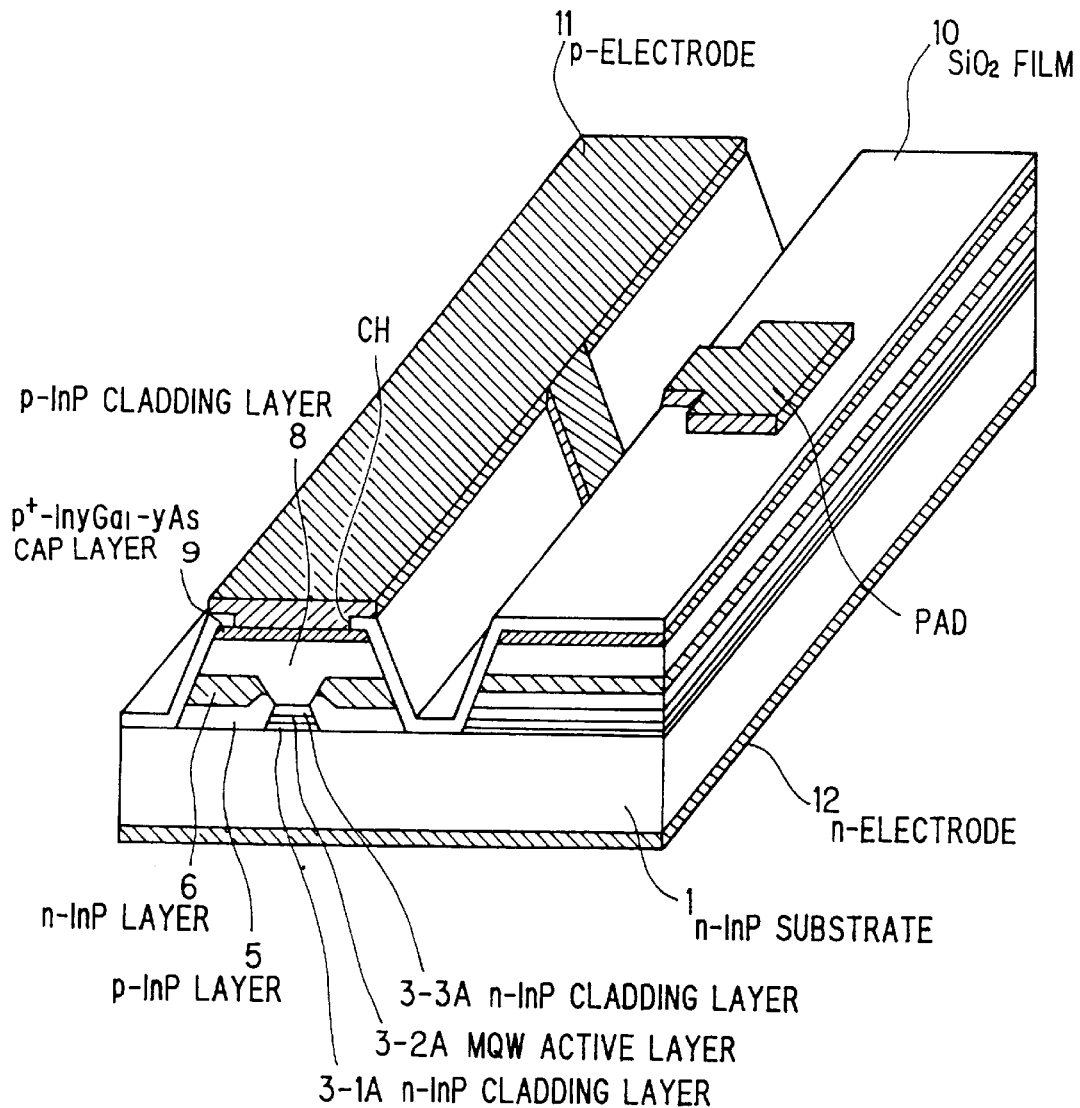
FIG. 6 is a perspective view showing a semiconductor laser in a first preferred embodiment according to the invention.

An optical semiconductor device and a method making the same in the first preferred embodiment will be explained in FIGS. 6 to 7D.

The optical semiconductor device in the first embodiment, which is given as an example of a semiconductor laser, comprises an optical waveguide where a stripe multilayer structure composed of a n-InP cladding layer 3-1A, a MQW active layer 3-2A and a p-InP cladding layer 3-3A with (111)B planes on both the side facets is selectively grown on a main plane((100) plane) of a n-InP substrate 1, and a semiconductor current blocking structure which is composed of a p-InP layer 5 and a n-InP layer 6 formed contacting the side facets of the optical waveguide, wherein the bottom surface of the semiconductor current blocking structure is selectively formed contacting only the (100) plane near to the optical waveguide.

The fabrication method of the optical semiconductor device in the first embodiment will be explained below.

Figure 7A:
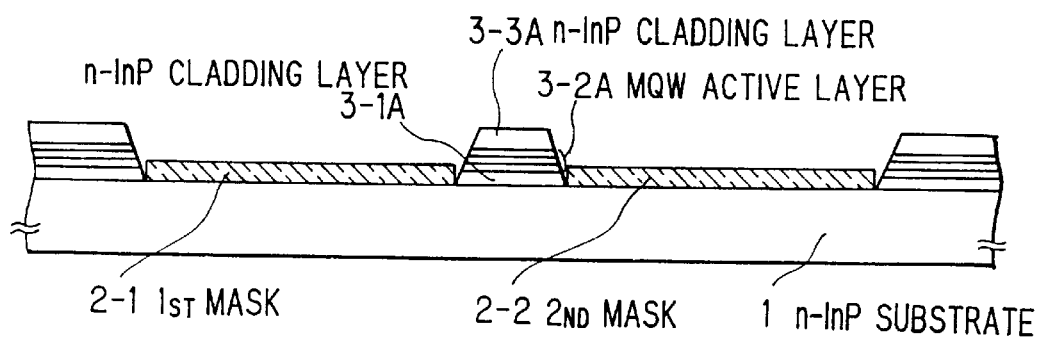
FIGS. 7A to 7D are cross sectional views showing a fabrication process of the semiconductor laser in the first embodiment.

First, as shown in FIG. 7A, a $SiO_2$ film is deposited 100 nm by atmospheric pressure CVD on the n-InP substrate 1 with a surface of (100) plane, then patterned like stripes running in the <011> direction of the n-InP substrate 1 to form a first mask 2-1 and a second mask 2-2. The opening width between the masks is 1.5 $\mu$m and the mask widths are 10 $\mu$m individually. Onto the 1.5 $\mu$m opening, an optical waveguide is selectively grown by using low pressure MOVPE (metal organic vapor phase epitaxy). The growth pressure is 100 hPa and the growth temperature is 625° C. Namely, a n-InP cladding layer 3-1A(carrier concentration: $1 \times 10^{18}$ cm$^{-3}$, thickness: 0.2 $\mu$m) is grown by using trimethylindium(TMIn) gas, phosphine($PH_3$) gas and disilane($Si_2H_6$) gas. Then, a multiquantum well(MQW) active layer 3-2A composed of 5 periods of undoped $In_{0.806}Ga_{0.194}As_{0.632}P_{0.368}$ well layer(5 nm)/undoped $In_{0.810}Ga_{0.190}As_{0.405}P_{0.595}$ barrier layer(8 nm) is formed. The well layer is formed by using mixed gas composed of TMIn gas, triethylgallium(TEGa) gas, arsine($AsH_3$) gas and $PH_3$ gas with flow rates of 142.1, 23.2, 26.8 and 83.8, respectively. The barrier layer is formed by using mixed gas composed of these gas with flow rates of 142.1, 22.7. 7.2 and 58.1, respectively. Then, a p--InP cladding layer 3-3A is grown by using TMIn gas, $PH_3$ gas and diethylzinc(DEZn) gas. optionally, the active layer may be a InGaAs/InGaAsP system MQW active layer, a InGaAsP bulk active layer, a InAlGaAs system MQW active layer, a InAsP system MQW active layer or the like, which can be grown by selective MOVPE. Namely, it is not limited to the InGaAsP/InGaAsP MQW structure.

Due to the plane direction dependendency of growth rate in the MOVPE growth method, (111)B plane is automatically formed on the side facet of the optical waveguide (multilayer structure of 3-1A, 3-2A and 3-3A) which is grown by selective MOVPE. and a very smooth mirror structure is thereby achieved. As a result, a dispersion loss in the optical waveguide can be significantly reduced.

Figure 7B:
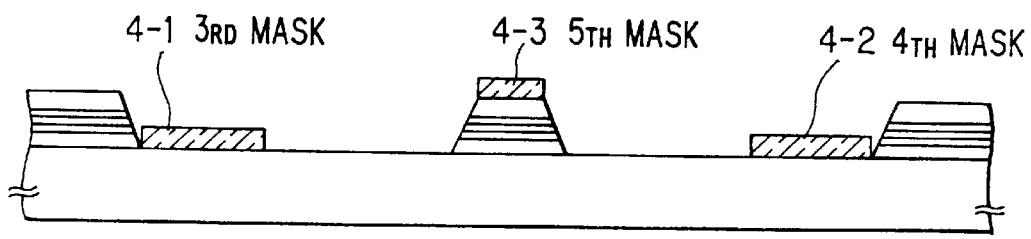

Next, a $SiO_2$ film is deposited on the entire surface while leaving the first mask 2-1 and the second mask 2-2 or after removing these. The $SiO_2$ film is formed thin on the side facet of the multilayer structure. Therefore, by conducting the isotropic etching until removing the $SiO_2$ film on the side facet of the multilayer structure and thereafter etching again by using a mask of resist film (not shown), a third mask 4-1, a fourth mask 4-2, which are 3 $\mu$m individually apart from the bottom of the optical waveguide, and a fifth mask 4-3 on the optical waveguide are formed as shown in FIG. 7B.

Figure 7C:
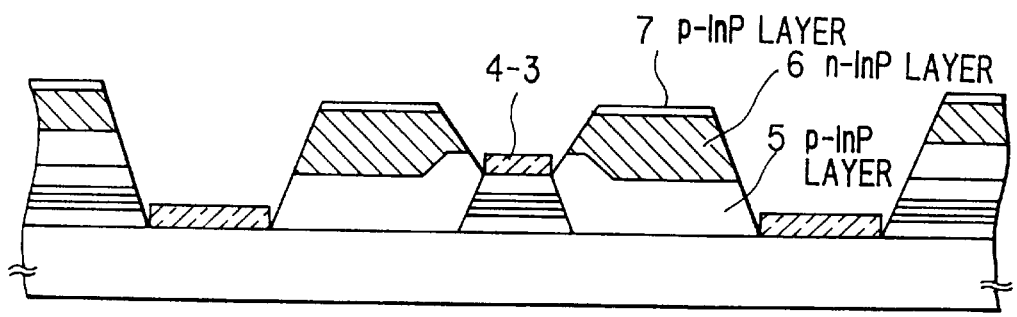
Figure 7D:
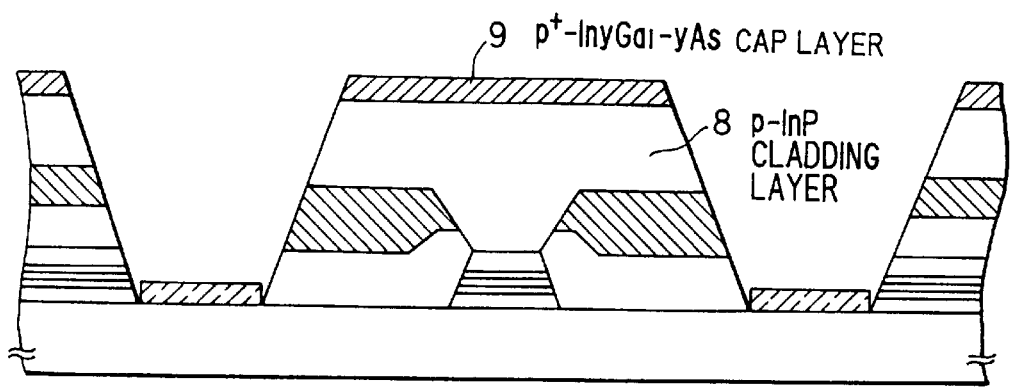

Then, as shown in FIG. 7C, by using the selective epitaxial growth by low pressure MOVPE, a p-InP layer 5 (carrier concentration: $5\times10^{17}cm^{-3}$, thickness: 0.5 $\mu$m), an-InP layer 6(carrier concentration: $7\times10^{17}cm^{-3}$, thickness: 0.5 $\mu$m) and a p-InP layer 7(carrier concentration: $7\times10^{17}cm^{-3}$, thickness: 0.1 $\mu$m) are buried at both sides of the optical waveguide. Though the p-InP layer 7 is inserted to prevent p-n junction from forming on a regrowth interface which is formed in the next process, it is not always necessary in this invention.

Then, after removing only the fifth mask 4-3 on the optical waveguide, a p-InP cladding layer 8(carrier concentration: $1\times10^{18}cm^{-3}$, thickness: 1.5 $\mu$m) and a $p^+$-$In_{0.53}Ga_{0.47}As$ cap layer 9(carrier concentration: $6\times100^{18}cm^{-3}$, thickness: 0.3 $\mu$m) are buried as shown in FIG. 7D. Finally, forming a $SiO_2$ film 10, a contact hole CH and p and n-electrodes 11, 12 as shown in FIG. 6, the laser structure is obtained.

In the measurement of the semiconductor laser in the first embodiment, where the laser structure is cut off by 300 $\mu$m length and film coatings with reflectivities of 30% and 70% are formed on its front facet and rear facet, respectively, a laser oscillation wavelength of 1.31 $\mu$m, a threshold current of 4.0 mA and a slope efficiency of 0.60 W/A are obtained at 25° C., as well as a high product yield thereof. Also, a device capacity of 7 pF and a 3 dB modulation band width of 9 GHz are obtained therein. Furthermore, in the measurement of the semiconductor laser in the first embodiment, where the laser structure is cut off by 150 $\mu$m length and film coatings with reflectivities of 80% and 95% are formed on its front facet and rear facet, respectively, a threshold current of 0.8 mA and a slope efficiency of 0.45 W/A are obtained as well as a high product yield thereof.

An optical semiconductor device and a method making the same in the second preferred embodiment will be explained in FIGS. 8 to 10D, wherein like parts are indicated by like reference numerals as used in FIG. 6. The optical semiconductor device in the second embodiment is given as an example of a DFB laser/EA modulator integrated light source.

The fabrication method of the optical semiconductor device in the second embodiment will be explained in FIGS. 9A to 10D.

Figure 9A:
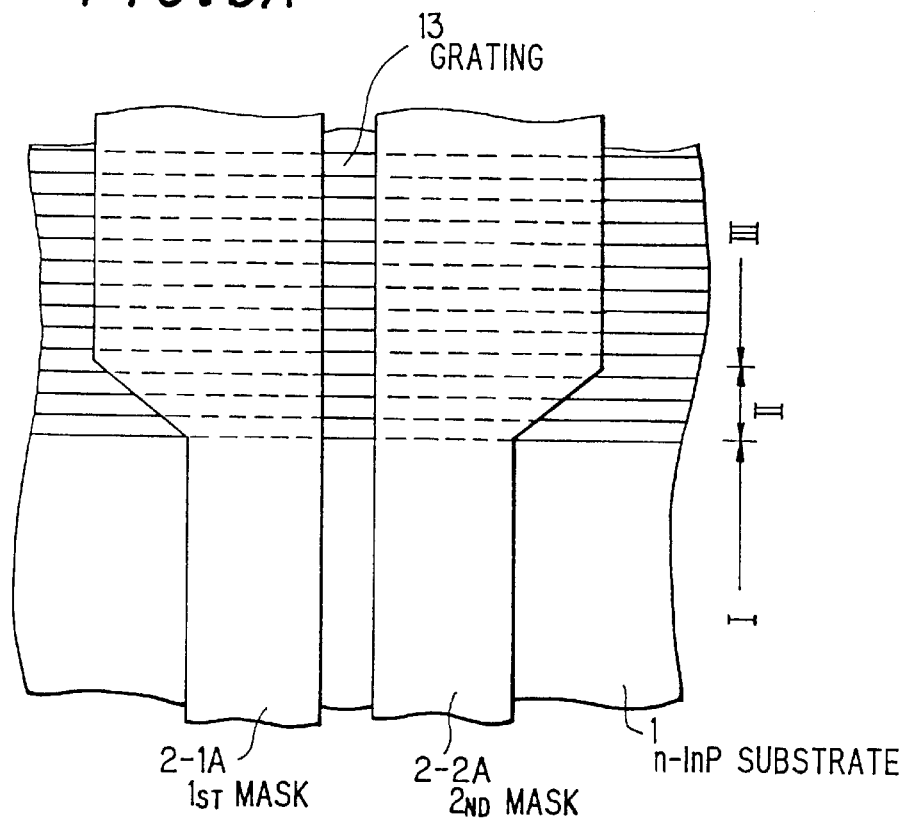
FIGS. 9A and 9B are plan views showing a fabrication process of the DFB laser/EA modulator integrated light source in the second embodiment.

First, as shown in FIG. 9A, a grating 13 with pitches of 240 nm is partially formed on the (100) plane of a n-InP substrate 1 by the interference exposure method. Then, a $SiO_2$ film is deposited on the entire surface of the substrate by atmospheric pressure CVD, patterned to give stripes in the <011> direction to form a first mask 2-1A and a second mask 2-2A which are mirror-symmetrical to each other. The opening width between the masks is 1.5 $\mu$m, and the mask widths are 5 $\mu$m for a modulator region I and 15 $\mu$m for a laser region III. Then, like the first embodiment, an optical waveguide is selectively grown onto the 1.5 $\mu$m opening by low pressure MOVPE. The growth pressure is 100 hPa and the growth temperature is 625° C.

Figure 9B:
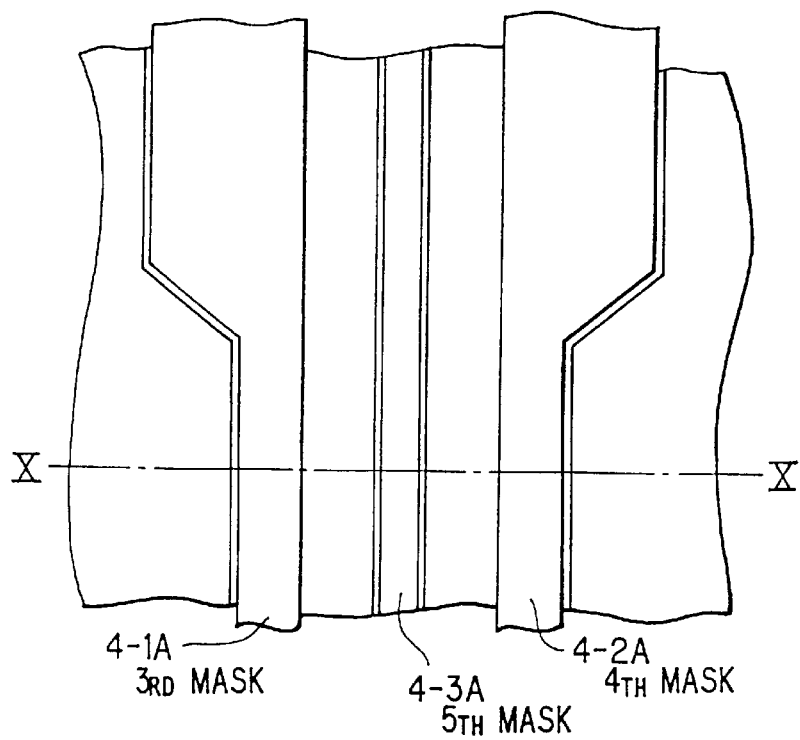
Figure 10A:
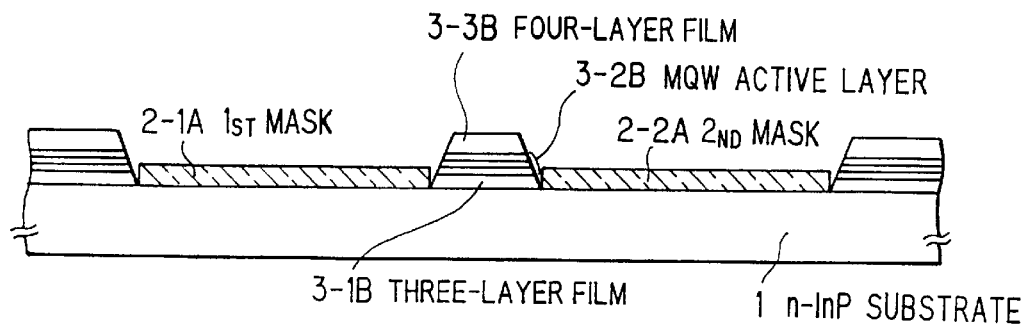
FIGS. 10A to 10D are cross sectional views showing the fabrication process of the DFB laser/EA modulator integrated light source in the second embodiment.

The optical waveguide is, as shown in FIGS. 9B and 10A(enlarged cross sectional view cut along the line X—X in FIG. 9B), comprises a three-layer film 3-1B composed of a n-$In_{0.76}Ga_{0.24}As_{0.511}P_{0.489}$ guiding layer(50 nm thick), a n-InP spacer layer(30 nm thick) and a $In_{0.76}Ga_{0.24}As_{0.511}P_{0.489}$SCH layer(light confinement layer, 30 $\mu$m thick), a MQW active layer 3-2B composed of eight periods of $In_{0.664}Ga_{0.336}As_{0.856}P_{0.144}$ well layer (6.5 nm)/ $In_{0.76}Ga_{0.24}As_{0.511}P_{0.489}$ barrier layer(6.0 nm), and a four-layer film 3-3B composed of a $In_{0.76}Ga_{0.24}As_{0.511}P_{0.489}$ SCH layer(light confinement layer, 20 nm thick), a $In_{0.81}Ga_{0.19}As_{0.405}P_{0.595}$ first intermediate layer(20 nm), a p$In_{0.875}Ga_{0.125}As_{0.405}P_{0.595}$ second intermediate layer(20 nm) and a p-InP cladding layer(100 nm). These compositions and thicknesses are provided for the modulator region I with the mask width of 5 $\mu$m. In the laser region III with the mask width of 15 $\mu$m, the film thickness are increased to about 1.45 times and the ratio of In of the In-Ga-As-P four-element compound is increased to about 0.022, thereby narrowing the bandgap. In the microscopic photoluminescence(PL) measurement as to the modulator region and laser region, PL wavelengths of 1.480 $\mu$m, 1.555 $\mu$m are obtained for the modulator region and laser region, respectively.

When the $In_{0.76}Ga_{0.24}As_{0.511}P_{0.489}$ layer, $In_{0.664}Ga_{0.336}As_{0.856}P_{0.144}$ layer, $In_{0.81}Ga_{0.19}As_{0.405}P_{0.595}$ layer and $In_{0.875}Ga_{0.336}As_{0.405}P_{0.595}$ layer of the modulator region I are formed, the gas flow rates of TMIn gas, TEGa gas, $AsH_3$ gas and $PH_3$ are 142.1;32.10:11.50:62.0, 142.1:36.2;31.7:57.5, 142.1:22.7:7.2:58.1 and 142.1:13.0;6.0:131.0, respectively. DEZn gas or $Si_2H_6$ gas is used as a dopant gas depending on p- or n-type.

Figure 10B:
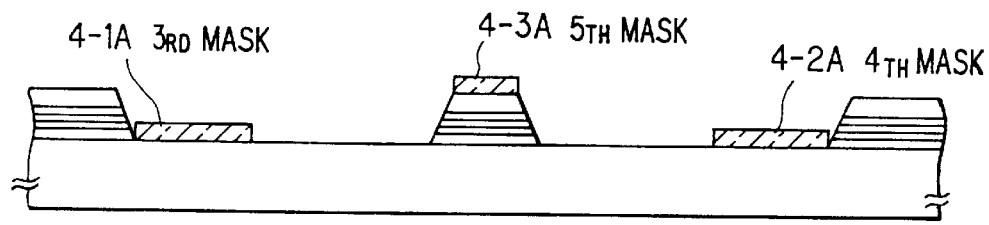
Figure 10C:
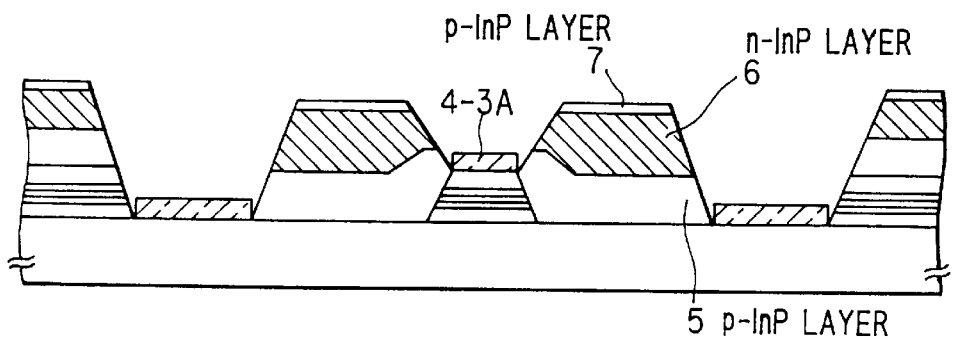

Next, like the first embodiment, a third mask 4-1A, a fourth mask 4-2A, which are of $SiO_2$ film and are 3 $\mu$m individually apart from the bottom of the optical waveguide, and a fifth mask 4-3A on the optical waveguide which is of $SiO_2$ film are formed as shown in FIG. 10B. Then, as shown in FIG. 10C, a p-InP layer 5(carrier concentration $5\times10^{17}$ $cm^{-3}$, thickness; 0.5 $\mu$m), an InPlayer 6(carrier concentration; $7\times10^{17}cm^{-3}$, thickness: 0.5 $\mu$m) and a p-InP layer 7(carrier concentration; $4\times10^{17}$ $cm^{-3}$, thickness: 0.1 $\mu$m) are buried at both sides of the optical waveguide. Though the p-InP layer 7 is inserted to prevent p-n junction from forming on a regrowth interface which is formed in the next process, it is not always necessary in this invention.

Figure 10D:
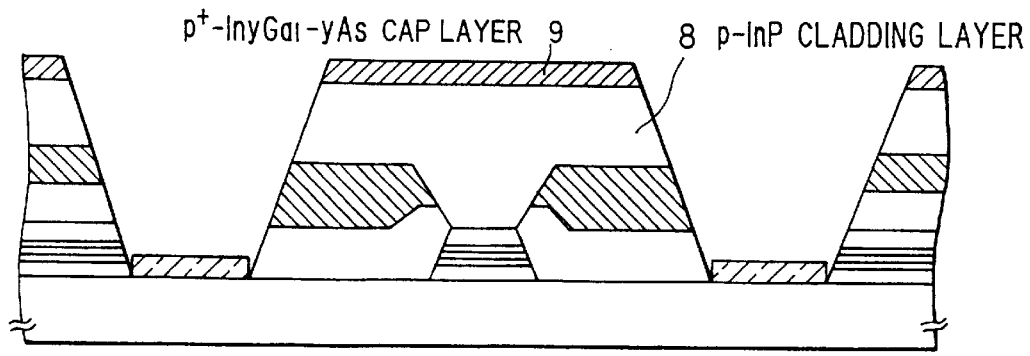

Then, after removing only the fifth mask 4-3A on the optical waveguide, a p-InP cladding layer 8 (carrier concentration: $1\times10^{18}cm^{-3}$, thickness; 1.5 $\mu$m) and a $p^+$-$In_{0.53}Ga_{0.47}As$ cap layer 9(carrier concentration: $6\times10^{18}$ $cm^{-3}$, thickness: 0.3 $\mu$m) are buried as shown in FIG. 10D.

Figure 8:
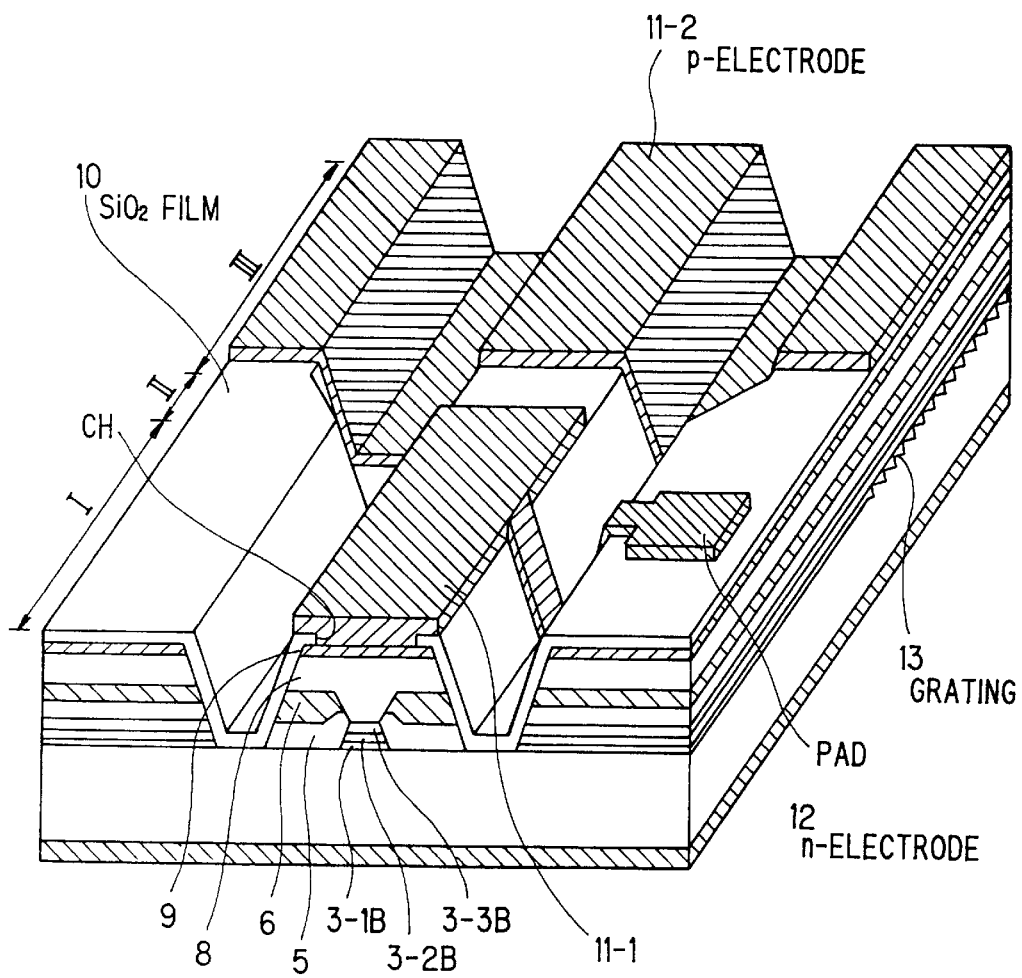
FIG. 8 is a perspective view showing a DFB laser/EA modulator integrated light source in a second preferred embodiment according to the invention.

Finally, forming a SiO$_2$ film 10, a contact hole CH and p- and n-electrodes 11-1(11-2), 12 as shown in FIG. 8, the DFB laser/EA modulator integrated light source is obtained.

In the measurement of the semiconductor laser in the second embodiment, where the DFB laser region III and modulator region I are cut off by 400 μm, 200 μm, respectively, and film coatings with reflectivities of 90% and 0.1% are formed on its DFB laser facet and modulator facet, respectively, a laser oscillation wavelength of 1.552 μm, a threshold current of 4.0 mA, a slope efficiency of 0.30 W/A and maximum light output power of more than 35 mW and an extinction ratio of more than 20 dB in case of 2V reverse bias voltage applied to the modulator are obtained at 25° C., as well as a high product yield thereof. Also. a 3 dB modulation band width of 7.5 GHz and a power penalty of less than 0.5 dB after 2.5 Gb/s-300 km normal fiber transmission are obtained therein.

Figure 11:
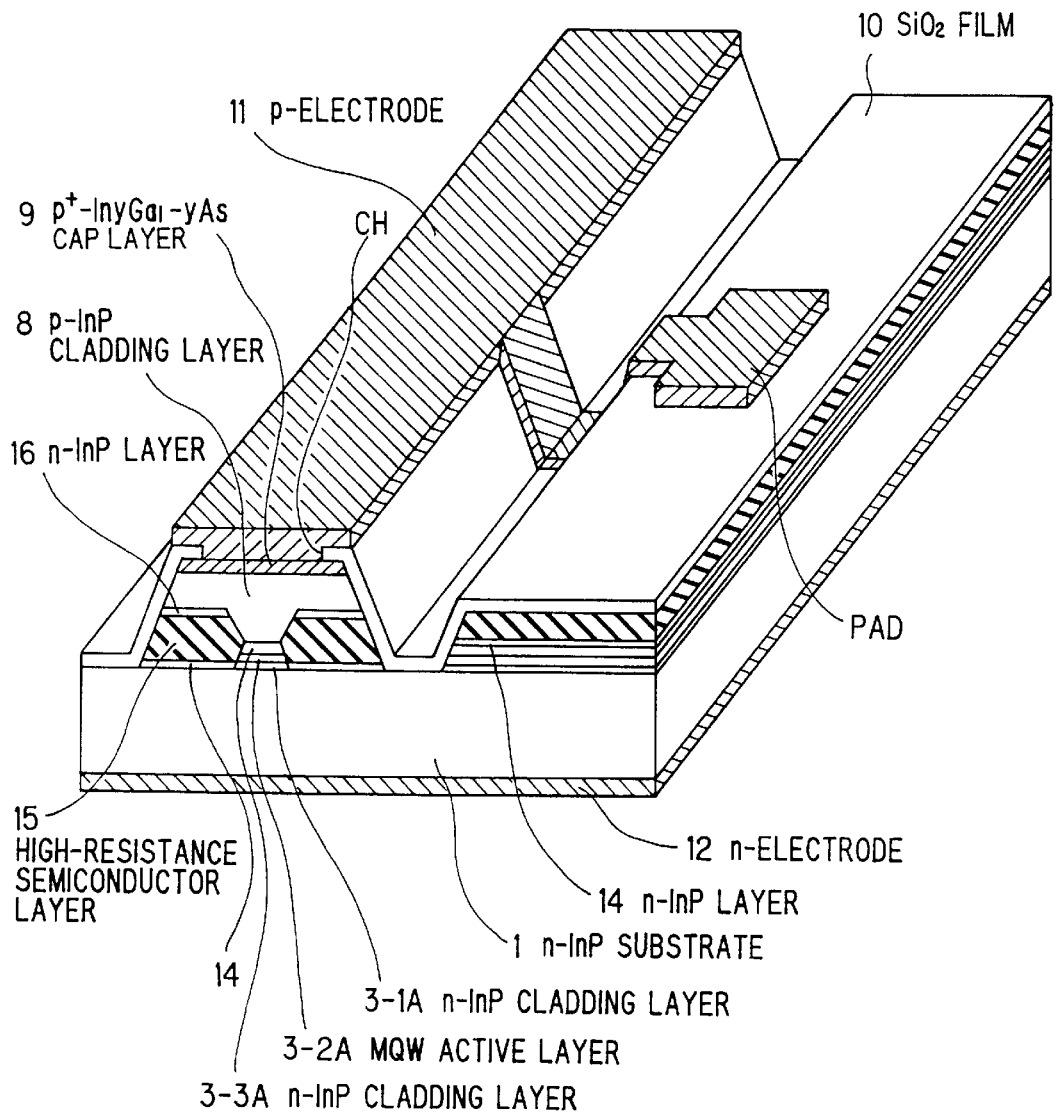
FIG. 11 is a perspective view showing a semiconductor laser in a third preferred embodiment according to the invention.

An optical semiconductor device and a method making the same in the third preferred embodiment will be explained in FIGS. 11 to 12D. The optical semiconductor device in the third embodiment is given as an example of a semiconductor laser.

The fabrication method of the optical semiconductor device in the third embodiment will be explained below.

Figure 12A:
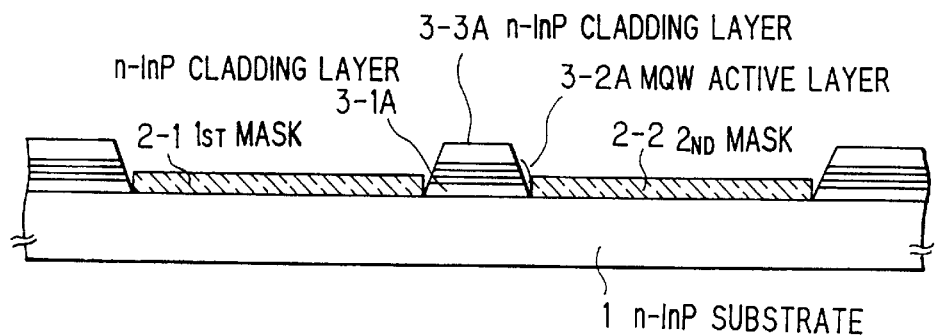
FIGS. 12A to 12D are cross sectional views showing a fabrication process of the semiconductor laser in the third embodiment.
Figure 12B:
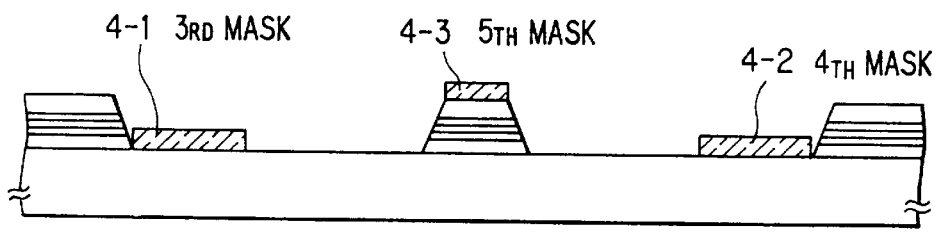
Figure 12C:
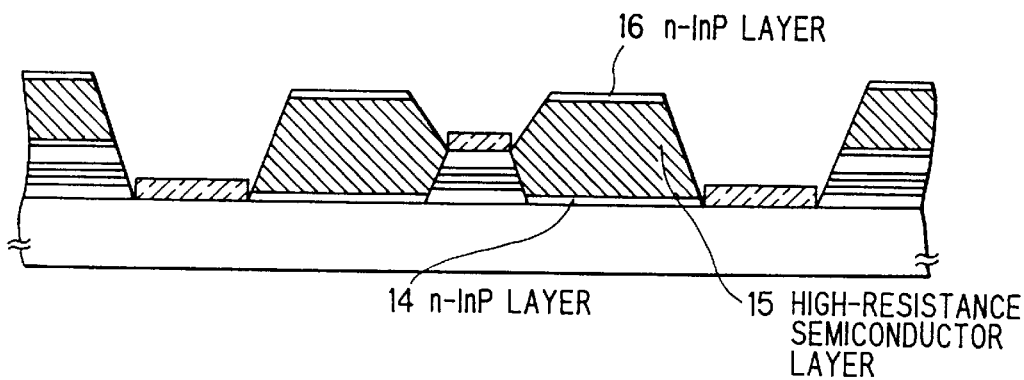

First, as shown in FIG. 12A, like the first embodiment, a SiO$_2$ film is deposited 100 nm by atmospheric pressure CVD on a n-InP substrate 1, then patterned like stripes running in the <011> direction of the n-InP substrate 1 to form a first mask 2-1 and a second mask 2-2. The opening width between the masks is 1.5 μm and the mask widths are 10 μm individually. Onto the 1.5 μm opening, an optical waveguide which is composed of a n-InP cladding layer 3-1A, a MQW active layer 3-2A and a p-InP cladding layer 3-3A is selectively grown by using low pressure MOVPE. Then, a third mask 4-1, a fourth mask 4-2. which are of SiO$_2$ film and are 3 μm individually apart from the bottom of the optical waveguide, and a fifth mask 4-3 on the optical waveguide which is of SiO$_2$ film are formed as shown in FIG. 12B. Then, as shown in FIG. 12C, a n-InP layer 14 (carrier concentration: 5×10$^{17}$ cm$^{-3}$, thickness: 0.2 μm), a high-resistance semiconductor layer 15(thickness; 1.0 μm) and a n-InP layer 16(carrier concentration: 5×10$^{17}$ cm$^{-3}$, thickness: 0.2 μm) are selectively grown burying at both sides of the optical waveguide. The high-resistance semiconductor layer is may be a Fe-doped InP layer or undoped In$_{0.52}$Al$_{0.48}$As layer. The Fe-doped InP layer is formed by using biscyclopentadienyl iron(ferrocene) as a dopant material. The undoped In$_{0.52}$Al$_{0.48}$AS layer is formed by using TMIn, trimethylaluminum(TMAl) and AsH$_3$.

Figure 12D:
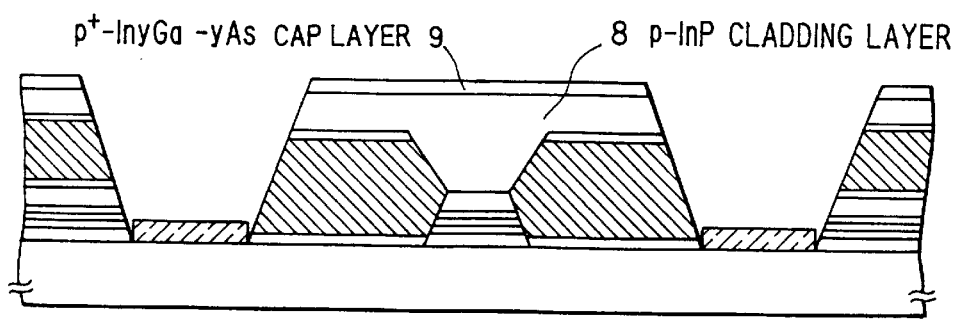

Next, after removing only the fifth mask 4-3 on the optical waveguide, ap-InP cladding layer 8 (carrier concentration: 1×10$^{18}$ cm$^{-3}$, thickness: 1.5 μm) and a p$^+$-In$_{0.53}$Ga$_{0.47}$As cap layer 9(carrier concentration: 6×10$^{18}$ cm$^3$, thickness: 0.3 μm) are buried as shown in FIG. 12D. Finally, after removing the p$^+$-In$_{0.53}$Ga$_{0.47}$As cap layer 9, p-InP layer 8 and n-InP layer 16 around the region where a pad electrode(PAD in FIG. 11) is formed, by forming a SiO$_2$ film 10, a contact hole CH and p- and n-electrodes 11, 12 as shown in FIG. 11, the laser structure is obtained.

In the measurement of the semiconductor laser in the third embodiment, where the laser structure is cut off by 300 μm length and film coatings with reflectivities of 30% and 70% are formed on its front facet and rear facet, respectively, a laser oscillation wavelength of 1.31 μm, a threshold current of 3.0 mA and a slope efficiency of 0.60 W/A are obtained at 25° C., as well as a high product yield thereof. Also, a device capacity of 1 pF and a 3 dB modulation band width of 20 GHz are obtained therein. Furthermore, in the measurement of the semiconductor laser in the third embodiment, where the laser structure is cut off by 150 μm length and film coatings with reflectivities of 80% and 95% are formed on its front facet and rear facet, respectively, a threshold current of 0.5 mA and a slope efficiency of 0.40 W/A are obtained as well as a high product yield thereof.

The above threshold current smaller than that of the semiconductor laser in the first embodiment is because of a more excellent current blocking function thereof. In the first embodiment(FIG. 6), a leakage current is flown through the p-InPlayer Snot covered by the n-InP layer 6 to the n-InP substrate 1. However, in the third embodiment(FIG. 11), little leakage current is flown through the high-resistance layer 15 to the n-InP substrate 1. On the other hand, the smaller device capacity and wider modulation band width in the third embodiment is because the distance between the pad electrode PAD and the opposite conductive film(n-InP film 14) serving as a capacitive electrode is long. Namely, in the first embodiment, the distance between the pad electrode PAD and the p$^+$-In$_{0.53}$Ga$_{0.47}$As cap layer 9 is short.

Figure 13:
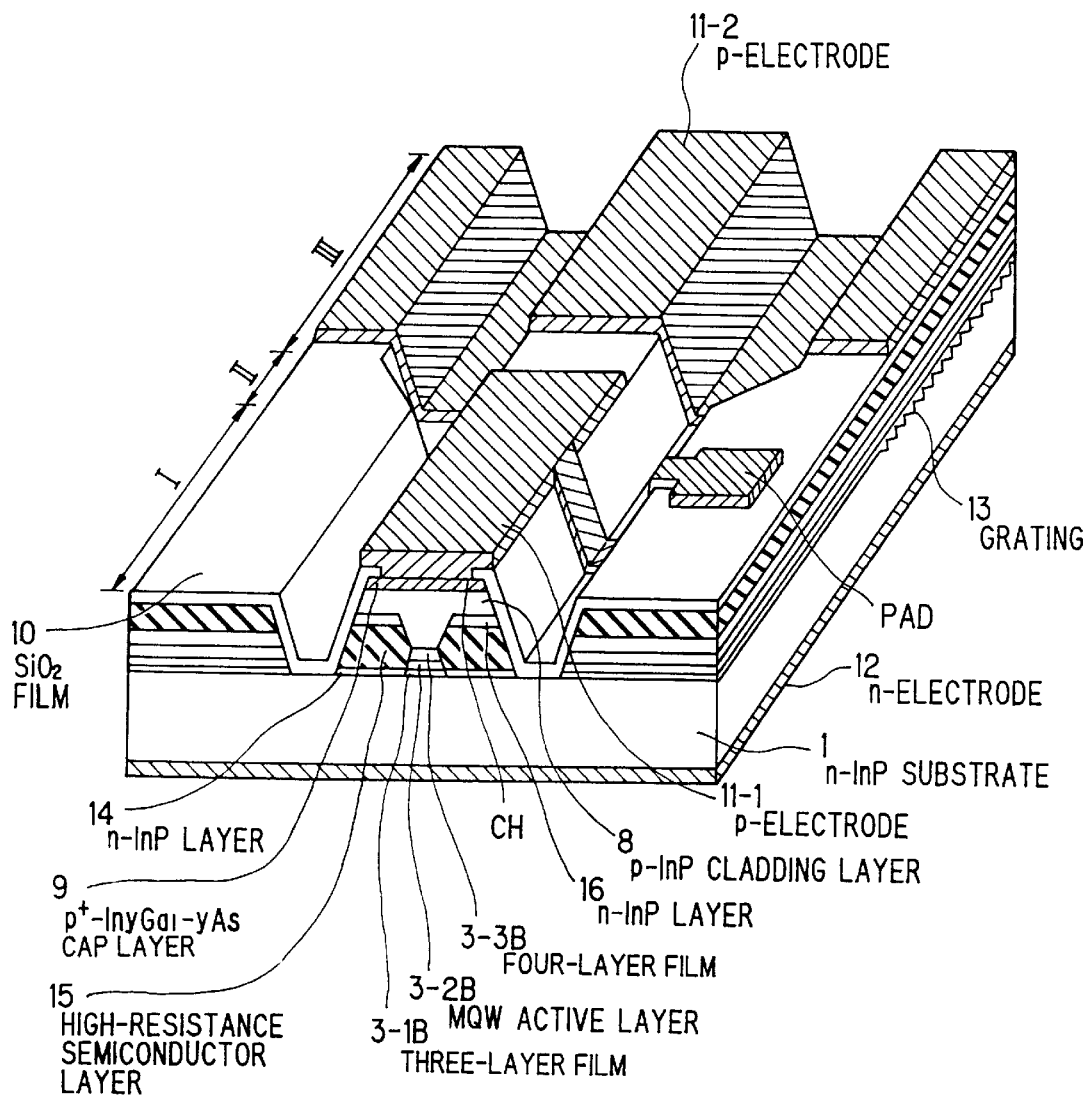
FIG. 13 is a perspective view showing a DFB laser/EA modulator integrated light source in a fourth preferred embodiment according to the invention.

An optical semiconductor device and a method making the same in the fourth preferred embodiment will be explained in FIG. 13, wherein like parts are indicated by like reference numerals as used in FIG. 8. The optical semiconductor device in the fourth embodiment is given as an example of a DFB laser/EA modulator integrated light source. In the fourth embodiment, the current blocking structure in FIG. 8 is replaced by a high-resistance semiconductor layer 15, which is sandwiched by n-InP layers 14, 16, like that in FIG. 11.

The fabrication method of the optical semiconductor device in the fourth embodiment will be explained below.

Like the second embodiment, an optical waveguide composed of a three-layer film 3-1B, a MQW active layer 3-2B and a four-layer film 3-3B is formed, and then, like the third embodiment, the n-InP layer 14, high-resistance layer 15 and n-InP layer 16 are sequentially formed. Then, a p-InP cladding layer 8 and a p$^+$-In$_{0.53}$Ga$_{0.47}$As cap layer 9 are formed, and, after removing the p$^+$In$_{0.53}$Ga$_{0.47}$As cap layer 9 etc. around the region where a pad electrode PAD is formed, electrodes 11-1(11-2) and 12 are formed.

In the measurement of the semiconductor laser in the fourth embodiment, where the DFB laser region III and modulator region I are cut off by 400 μm, 200 μm, respectively, and film coatings with reflectivities of 90% and 0.1% are formed on its DFB laser facet and modulator facet, respectively, a laser oscillation wavelength of 1.552 μm, a threshold current of 3.5 mA, a slope efficiency of 0.30 W/A and maximum light output power of more than 35 mW and an extinction ratio of more than 20 dB in case of 2V reverse bias voltage applied to the modulator are obtained at 25° C., as well as a high product yield thereof. Also, a 3 dB modulation band width of 16 Hz, a power penalty of less than 0.5 dB after 2.5 Gb/s-300 km normal fiber transmission, and a power penalty of less than 0.5 dB after 10 Gb/s-100 km normal fiber transmission are obtained therein. The reasons for the smaller threshold current and wider modulation band width in the fourth embodiment as compared with the second embodiment are as explained in the third embodiment.

Though the above embodiments are explained by taking examples of a semiconductor laser and a laser/modulator integrated light source, the invention can be applied to the case where an edge-emitting LED or semiconductor optical amplifier is used in place of the semiconductor laser.

Meanwhile, in FIGS. 6, 8, 11 and 13, the top and upper surfaces of the devices are hatched with oblique lines for convenience, but these oblique lines do not mean cross sections thereat.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making an optical semiconductor device, comprising the steps of:

forming a first mask and a second mask which selectively cover a planar surface of a semiconductor substrate of a first conductivity-type in mirror-symmetry to each other;

forming an optical waveguide composed of a multilayer structure including an active layer on said planar surface enclosed by said first and second masks by a selective epitaxial growth method, said optical waveguide having sidewalls with a specific crystalline plane;

forming a third mask and a fourth mask selectively covering said planar surface while sandwiching said optical waveguide and a fifth mask covering the top surface of said optical waveguide after removing said first and second masks;

forming a semiconductor current blocking structure composed of a bottom layer consisting of a second semiconductor layer of a second conductivity-type and a top layer consisting of a semiconductor layer of said first conductivity-type, formed on said second semiconductor layer, on a region which is not covered by said third, fourth and fifth masks by the selective epitaxial growth method, so that only the bottom layer of said semiconductor current blocking structure is in contact with sidewall surfaces of said optical waveguide; and forming a first semiconductor layer of a second conductivity type by a selective epitaxial growth method after removing said fifth mask.

2. A method for making an optical semiconductor device, according claim 1, wherein:

said first and second masks are formed on a (100) plane of said substrate along a <011> direction of said substrate.

3. A method for making an optical semiconductor device, device, wherein:

said semiconductor current blocking structure is composed of a high-resistance comprising the steps of:

forming a first mask and second mask which selectively cover a planar surface of a semiconductor substrate of a first conductivity-type in mirror-symmetry to each other;

forming an optical waveguide composed of a multilayer structure including an active layer on said planar surface enclosed by said first and second masks by a selective epitaxial growth method;

forming a third mask and fourth mask selectively covering said planar surface which sandwiching said optical waveguide and a fifth mask covering the top surface of said optical waveguide after removing said first and second masks;

forming a semiconductor current blocking structure composed of a high-resistance semiconductor layer on a region which is not covered by said third, fourth and fifth masks by the selective epitaxial growth method; and forming a semiconductor layer of a second conductivity type by a selective epitaxial growth method after removing said fifth mask.

4. A method for making an optical semiconductor device, according to 3, wherein:

said planar surface is a (100) plane, and said crystalline surface is a (111) B plane.

5. A method for making an optical semiconductor device, according claim 4, wherein:

said high-resistance semiconductor layer is a Fe-doped InP layer.

6. A method for making an optical semiconductor device, according claim 4, wherein:

said high-resistance semiconductor layer is an undoped $In_xAl_{1-x}As$ layer, where x is a numerical value defined by $0<x<1$.

7. A method for making an optical semiconductor device, according claim 3, wherein:

said high-resistance semiconductor layer is a Fe-doped InP layer.

8. A method for making an optical semiconductor device, according claim 3, wherein:

said high-resistance semiconductor layer is an undoped $In_xAl_{1-x}As$ layer, where x is a numerical value defined by $0<x<1$.

9. A method for making an optical semiconductor device, comprising the steps of:

forming a first mask and second mask which. selectively cover a planar surface having a specific crystallographic orientation of a semiconductor substrate of a first conductivity-type in mirror-symmetry to each other;

forming an optical waveguide composed of a multilayer structure including an active layer on said planar surface enclosed by said first and second masks by a selective epitaxial growth method, said optical waveguide having sidewalls with a specific crystalline plane;

forming a third mask and fourth masks selectively covering said planar surface while sandwiching said optical waveguide and fifth mask covering the top surface of said optical waveguide after removing said first and second masks;

forming a semiconductor current blocking structure composed of a bottom layer consisting of a second semiconductor layer of a second conductivity-type and a top layer consisting of a semiconductor layer of said first conductivity-type, formed on said second semiconductor layer, on a region which is not covered by said third, fourth and fifth masks by the selective epitaxial growth method, so that only the bottom layer of said semiconductor current blocking structure is in contact with sidewall surfaces of said optical waveguide; and forming a first semiconductor layer of a second conductivity type by a selective epitaxial growth method after removing said fifth mask.

* * * * *

UNITED STATES PATENT AND TRADEMARK OFFICE
CERTIFICATE OF CORRECTION

PATENT NO. : 6,134,368
DATED : October 17, 2000
INVENTOR(S) : Yasutaka Sakata

It is certified that error appears in the above-identified patent and that said Letters Patent is hereby corrected as shown below:

<u>Column 9,</u>
Lines 49-51, delete "wherein: said semiconductor current blocking structure is composed of a high-resistance".

Signed and Sealed this

Second Day of July, 2002

Attest:

JAMES E. ROGAN
Attesting Officer          Director of the United States Patent and Trademark Office